United States Patent
Yoshida

[19]
[11] Patent Number: 5,892,250
[45] Date of Patent: *Apr. 6, 1999

[54] SEMICONDUCTOR INTEGRATED CIRCUIT CHIP

[75] Inventor: Yuji Yoshida, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 787,773

[22] Filed: Jan. 29, 1997

[30] Foreign Application Priority Data

Jan. 30, 1996 [JP] Japan ..................... 8-013863

[51] Int. Cl.$^6$ ............... H01L 27/10; H01L 39/00
[52] U.S. Cl. ............ 257/202; 257/208; 257/207; 257/659
[58] Field of Search ................... 257/202, 207, 257/208, 211, 659, 664, 210

[56] References Cited

U.S. PATENT DOCUMENTS

| | | | |
|---|---|---|---|
| 4,514,749 | 4/1985 | Shoji | 257/664 |
| 5,045,725 | 9/1991 | Sasaki et al. | 257/208 |
| 5,060,045 | 10/1991 | Owada et al. | 257/211 |
| 5,309,015 | 5/1994 | Kuwata et al. | 257/207 |
| 5,357,140 | 10/1994 | Kozasa | 257/758 |
| 5,365,091 | 11/1994 | Yamagishi | 257/208 |
| 5,416,431 | 5/1995 | Strauss | 257/207 |
| 5,441,915 | 8/1995 | Lee | 257/211 |
| 5,491,352 | 2/1996 | Tsuji | 257/207 |
| 5,598,363 | 1/1997 | Uchida | 257/207 |
| 5,608,241 | 3/1997 | Shibuya et al. | 257/208 |
| 5,612,552 | 3/1997 | Owens | 257/202 |

FOREIGN PATENT DOCUMENTS

| | | |
|---|---|---|
| 59-136948 | 8/1984 | Japan . |
| 2-51252 | 2/1990 | Japan . |
| 4-196462 | 7/1992 | Japan . |

*Primary Examiner*—Mahshid D. Saadat
*Assistant Examiner*—Jhihan B. Clark
*Attorney, Agent, or Firm*—Foley & Lardner

[57] ABSTRACT

There is provided a semiconductor integrated circuit chip including (a) a semiconductor substrate, (b) an insulating film formed on the semiconductor substrate, (c) first, second and third timing pulse signal lines each of which is formed of a common metal wiring layer and from which clock skew is generated, (d) an internal circuit to which the first, second and third timing pulse signal lines are electrically connected, (e) a first control signal line being designed to keep a high level while the internal circuit is in operation, and (f) a second control signal line being designed to keep a low level while the internal circuit is in operation. The second control line is disposed adjacent to and in parallel with one of sides of the first timing pulse signal line, the second timing pulse signal line is disposed adjacent to and in parallel with a side of the second control signal line at the opposite side of the first timing pulse signal line, the first control signal line is disposed adjacent to and in parallel with the other side of the first timing pulse signal line, and the third timing pulse signal line is disposed adjacent to and in parallel with a side of the first control signal line at the opposite side of the first timing pulse signal line. In the semiconductor integrated circuit chip, the first, second and third timing pulse signal lines are shielded with the first and second control signal lines to thereby reduce a time constant on signal transmission in the timing pulse signal lines, resulting in almost zero clock skew.

20 Claims, 4 Drawing Sheets

SEMICONDUCTOR INTEGRATED CIRCUIT CHIP

BACKGROUND OF THE INVENTION

1. Field of the Invention

The invention relates to a semiconductor integrated circuit chip, and more particularly to a reduction in clock skew of clock pulses provided to an element of a semiconductor integrated circuit chip.

2. Description of the Related Art

With development of technology for fabricating a smaller and smaller semiconductor device with regard to size, a circuit scale required for a semiconductor integrated circuit chip becomes larger, and higher complexity in function and higher speed in operation are required. For meeting these requirements, internal wirings in a semiconductor integrated circuit chip have become longer and longer in length between the functional blocks constituting parts of the chip and a dock driver distributing operation clocks to the functional clocks, resulting in skew that may be generated because of a difference in clock wiring length.

As is well known to those skilled in the art, clock skew means a difference between a time at which a clock or timing pulse is expected to arrive at a functional block and a time at which a clock has actually arrived at a functional block. The reason why clock skew is generated is explained as follows. For instance, when comparing a flip-flop disposed closest to a clock driver with a flip-flop disposed most remote from the clock driver, they have different time constants of wiring resistance and through hole resistance to wiring capacity and flip-flop input capacity. Thus, the clocks are out of phase at input terminals of respective flip-flops.

Accordingly, it is quite important to eliminate clock skew in order to operate a chip at a higher rate. Various attempts have been made to decrease clock skew. For instance, divided clock lines have been designed to have a common length, or a clock line has been designed to be quite short in length. One of the methods of reducing clock skew has been suggested in Japanese Unexamined Patent Publication No. 59-136948, which will be explained hereinbelow.

FIG. 1 is an enlarged perspective view illustrating a circuit for preventing occurrence of clock skew in an integrated circuit chip, suggested in the Publication No. 59-136948. The illustrated semiconductor integrated circuit 200 includes a silicon substrate 18, a clock distributing line 12 formed on the substrate 18, first and second electrically conductive lines 14 and 15 disposed so that the clock distributing line 12 is interposed between the first and second electrically conductive lines 14 and 15, and two pulse carry lines 11 and 13 disposed outside the first and second electrically conductive lines 14 and 15, respectively, a ground bus 16, and a wire for bonding the ground bus 16 to an external electrode 17. The first and second electrically conductive lines 14 and 15 are directly, electrically connected to the ground bus 16 so that the first and second lines 14 and 15 have a grounded level. By disposing the electrically conductive lines 14 and 15 so that they interpose the clock distributing line 12 therebetween, the clock distributing line 12 is electrostatically shielded from the pulse carry lines 11 and 13.

In other words, the clock distributing line or timing pulse distributing line 12 is shielded by disposing it between the first and second lines 14 and 15, both having a fixed dc level. By shielding the timing pulse distributing line 12, a side capacity between sides of those lines 12, 14, 15 is varied.

Assuming that a capacity between the timing pulse distributing line 12 and the first and second electrically conductive lines 14 and 15 is represented as Cs and a capacity between the timing pulse distributing line 12 and the silicon substrate 18, arranged in insulating relation with each other, is represented as Cb, the side capacity is maximized when a potential between the lines 12 and 14 has a different sign as that of a potential between the lines 12 and 15. The maximum side capacity is equal to (4Cs+Cb). On the other hand, the side capacity is minimized when a potential between the lines 12 and 14 has the same sign as that of a potential between the lines 12 and 15. The minimum side capacity is equal to Cb.

According to the above mentioned Publication No. 59-136948, a capacity between the timing pulse distributing line 12 and the first and second lines 14, 15 is varied to nearly 3 pF, thereby ensuring almost zero clock skew.

In the above mentioned Publication, by disposing the timing pulse distributing line 12 in parallel between the lines having a fixed dc level or power distributing lines 14 and 15, there is produced a difference in potential between the timing pulse distributing line 12 and the lines 14, 15. As the result, a capacity between the lines 12, 14, 15 is varied to thereby ensure a quite small side capacity. Accordingly, the time constant on signal transmission through the timing pulse distributing line can be decreased to thereby make it possible to reduce clock skew down to almost zero.

In general, the power distributing lines 14 and 15 are required to have a small resistivity in order to ensure a large current capacity and small voltage drop. If a line has a uniform thickness, the resistivity of the line is dependent on a cross-sectional area thereof. Thus, a power distributing line is generally designed to have a larger width. Hence, unless the power distributing lines are efficiently arranged, the lines occupy a larger area with the result being a larger area of an integrated circuit chip.

In the prior semiconductor integrated circuit chip illustrated in FIG. 1, the power distributing lines 14 and 15 arranged in parallel with the timing pulse distributing line 12 are designed to have the same width as that of an ordinary signal line to thereby make a cross-sectional area thereof smaller. However, it is necessary for the lines 14 and 15 to at least partially have a wider portion for making a through hole contact. The through hole contact requires a much larger area than that of an ordinary signal line, resulting in that the contact has to have a large wiring area therearound.

SUMMARY OF THE INVENTION

In view of the foregoing problems of prior art, it is an object of the present invention to provide a semiconductor integrated circuit chip capable of minimizing the increase in a cross-sectional area of a shield line, even if the shield line is arranged in parallel to a timing pulse distributing line for preventing clock skew.

There is provided a semiconductor integrated circuit chip including (a) at least one first signal line from which clock skew is generated, (b) an internal circuit to which the first signal line is electrically connected, and (c) at least one second signal line being kept to have a fixed potential while the internal circuit is in operation. The second signal line is an element indispensable for constituting the semiconductor integrated circuit chip, and is disposed adjacent to and in parallel with the first signal line at either side thereof, therebelow or thereabove.

There is further provided a semiconductor integrated circuit chip including (a) N first signal lines from which clock skew is generated wherein N is a positive integer equal to or greater than two, (b) an internal circuit to which the first signal lines are electrically connected, and (c) (N-1) second signal line(s) being kept to have a fixed potential while the internal circuit is in operation, the second signal line being an element indispensable for constituting the semiconductor integrated circuit chip, each of the second signal line(s) being disposed intermediate between the first signal lines.

For instance, the first signal lines may be arranged horizontally or vertically with the second signal lines. The first and second signal lines may be arranged with non-uniform spaces therebetween, but it is preferable that the first and second signal lines are equally spaced from one another.

There is still further provided a semiconductor integrated circuit chip including (a) a semiconductor substrate, (b) an insulating film formed on the semiconductor substrate, (c) first, second and third timing pulse signal lines each of which is formed of a common metal wiring layer and from which clock skew is generated, (d) an internal circuit to which the first, second and third timing pulse signal lines are electrically connected, (e) a first control signal line being designed to keep a high level while the internal circuit is in operation, and (f) a second control signal line being designed to keep a low level while the internal circuit is in operation. The second control line is disposed adjacent to and in parallel with one of sides of the first timing pulse signal line, the second timing pulse signal line is disposed adjacent to and in parallel with a side of the second control signal line at the opposite side of the first timing pulse signal line, the first control signal line is disposed adjacent to and in parallel with the other side of the first timing pulse signal line, and the third timing pulse signal line is disposed adjacent to and in parallel with a side of the first control signal line at the opposite side of the first timing pulse signal line.

In the above mentioned semiconductor integrated circuit chip, the first and second control signal lines may be replaced in position with each other.

There is yet further provided a semiconductor integrated circuit chip including (a) a semiconductor substrate, (b) an insulating film formed on the semiconductor substrate, (c) first, second and third timing pulse signal lines each of which is formed of a common metal wiring layer and from which dock skew is generated, (d) an internal circuit to which the first, second and third timing pulse signal lines are electrically connected, (e) a first control signal line being designed to keep a high level while the internal circuit is in operation, and (f) a second control signal line being designed to keep a low level while the internal circuit is in operation. Each of the first and second control signal lines is disposed intermediate between the first, second and third timing pulse signal lines. For instance, assuming that the second timing pulse signal line is located between the first and third timing pulse signal lines, the first control signal line is disposed intermediate between the first and second timing pulse signal lines, and the second control signal line is disposed intermediate between the second and third timing pulse signal lines.

It is preferable that the first and second control signal lines are equally spaced from the first, second and third timing pulse signal lines.

There is still yet further provided a semiconductor integrated circuit chip including (a) a semiconductor substrate, (b) an insulating film formed on the semiconductor substrate, (c) N timing pulse signal lines each of which is formed of a common metal wiring layer and from which clock skew is generated wherein N is a positive integer equal to or greater than two, (d) an internal circuit to which the timing pulse signal lines are electrically connected, (e) L first control signal line(s) being designed to keep a high level while the internal circuit is in operation wherein L is an integer equal to or greater than zero, and (f) M second control signal line (s) being designed to keep a low level while the internal circuit is in operation wherein M is an integer equal to or greater than zero, the sum of L and M being equal to (N-1). Each of the first and second control signal lines is disposed intermediate between the timing pulse signal lines.

There is further provided a semiconductor integrated circuit chip including (a) a semiconductor substrate, (b) an internal circuit to which later mentioned first and second timing pulse signal lines are electrically connected, (c) a first timing pulse signal line which is composed of a first metal layer formed above the semiconductor substrate in insulating relation and from which clock skew is generated, (d) a control signal line which is composed of a second metal layer formed above the first timing pulse signal line in insulating relation and which is designed to have a fixed potential while the internal circuit is in operation, and (e) a second timing pulse signal line which is composed of a third metal layer formed above the control signal line in insulating relation from which clock skew is generated.

In the above mentioned semiconductor integrated circuit chip, the control signal line may be designed to keep a high or low level while the internal circuit is in operation. It is preferable that the first timing pulse signal line, the control signal line and the second timing pulse signal line are equally spaced from one another.

There is further provided a semiconductor integrated circuit chip including (a) a semiconductor substrate, (b) N timing pulse signal lines each composed of a metal layer and vertically disposed above the semiconductor substrate in insulating relation with one another wherein N is a positive integer equal to or greater than two, clock skew being generated from the timing pulse signal lines, (c) an internal circuit to which the timing pulse signal lines are electrically connected, and (d) (N-1) control signal line(s) each composed of a metal layer and designed to have a fixed potential while the internal circuit is in operation. Each of the control signal line(s) is disposed vertically intermediate between the timing pulse signal lines in insulating relation with one another.

As mentioned above, in accordance with the inventive semiconductor integrated circuit chip, a signal line or signal lines, for instance, comprising a standby signal feeding line and a reset signal feeding line is(are) disposed in parallel between a plurality of timing pulse signal lines formed of a common metal wiring layer formed on an insulating layer formed on a silicon substrate. As an alternative, a signal line such as a reset signal feeding line composed of a second metal layer is formed above a timing pulse signal line composed of a first metal layer with an insulating film sandwiched therebetween, and further another timing pulse signal line composed of a third metal layer is formed above the reset signal feeding line with an insulating film sandwiched therebetween. In addition, the standby and reset signals are while an internal circuit dc potential while an internal circuit such as a central processing unit (CPU) is in operation. For instance, the standby signal is designed to keep a low level or "0" level, whereas the reset signal is designed to keep a high level or "1" level. Thus, the timing pulse signal lines are surrounded by the standby and reset signal feeding lines to thereby make it possible to reduce clock skew generated from the timing pulse signal lines.

In addition, since the reset and standby signal lines which are essentially necessary for establishing a circuit are utilized for shielding the timing pulse signal lines, it is possible to minimize an increase in a total wiring area of a semiconductor integrated circuit chip required only for shielding.

Furthermore, since a minimum unit of contact holes are used for making connection, it is no longer necessary to have a large contact area for minimizing wiring resistivity like a case wherein power distributing lines are to be used, contributing to lowered fabrication costs of a chip.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1:
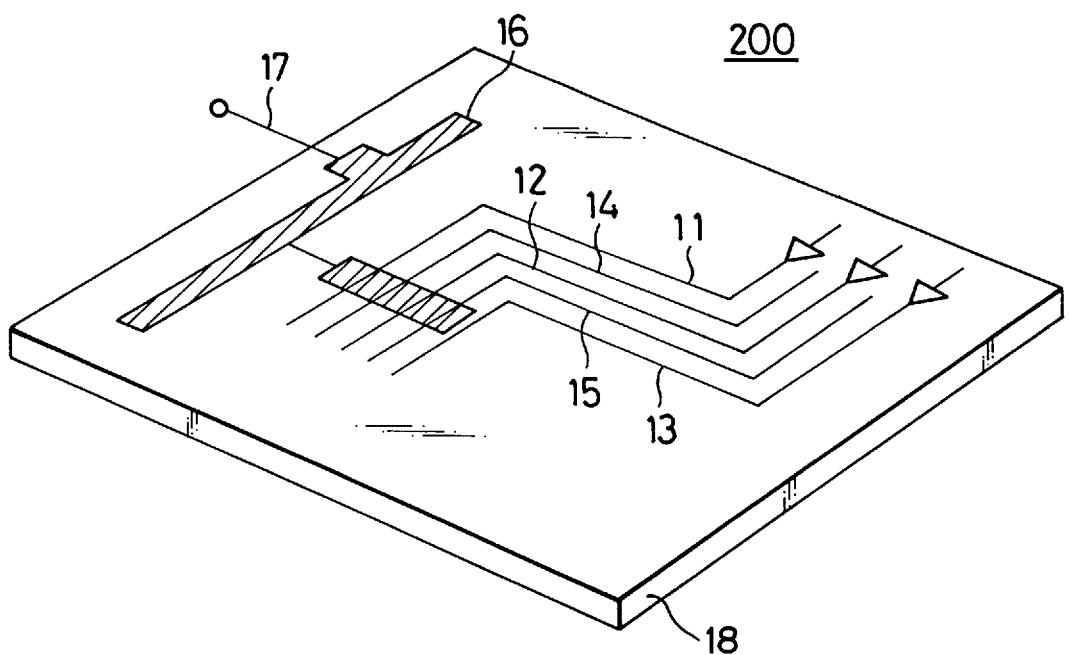
FIG. 1 is a perspective view illustrating a conventional semiconductor integrated circuit chip.
Figure 2:
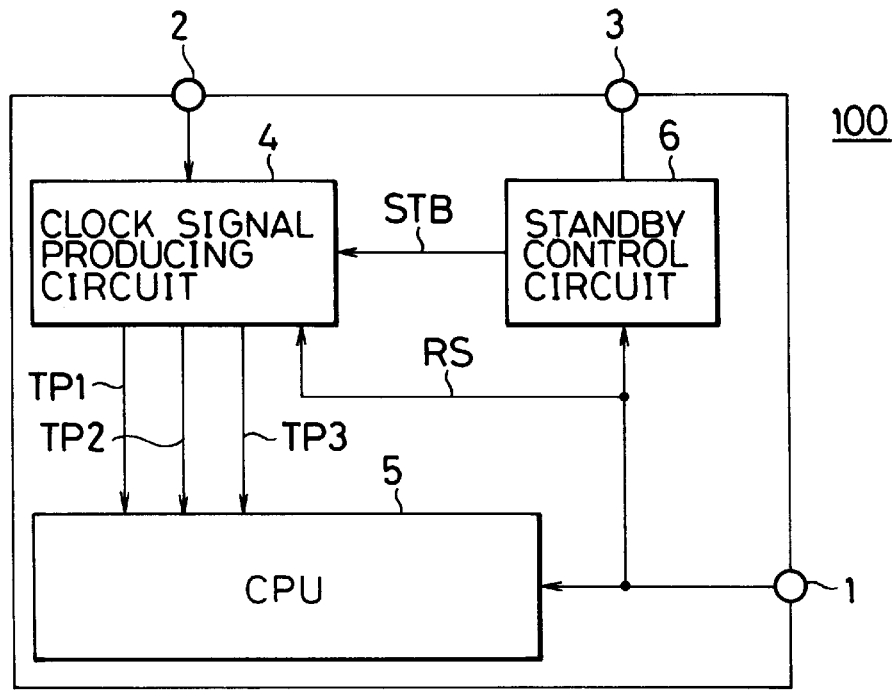
FIG. 2 is block diagram of a semiconductor integrated circuit chip made in accordance with the first embodiment of the present invention.

FIG. 2 is a block diagram a semiconductor integrated circuit chip made in accordance with the first embodiment of the present invention. The illustrated semiconductor integrated circuit chip 100 includes (a) a reset signal input terminal 1 at which a reset signal (hereinafter, referred to simply as "RS") as a first control signal is received, (b) a clock signal input terminal 2 at which clock signals are received, (c) a standby control signal input terminal 3 at which standby control signals are received, (d) an internal clock signal producing circuit 4 for producing timing pulse signals TP1, TP2 and TP3 from clock signals transmitted thereto through the clock signal input terminal 2 and emitting the thus produced timing pulse signals TP1, TP2 and TP3 to a later mentioned internal circuit, (e) an internal circuit such as a central processing unit 5 (hereinafter, referred to simply as "CPU") responsive to the timing pulse signals TP1, TP2 and TP3 to thereby carry out control operations, and (f) a standby control circuit 6 for producing standby signals (hereinafter, referred to simply as "STB") as second control signals for controlling the start and stop operation of CPU 5.

Figure 3:
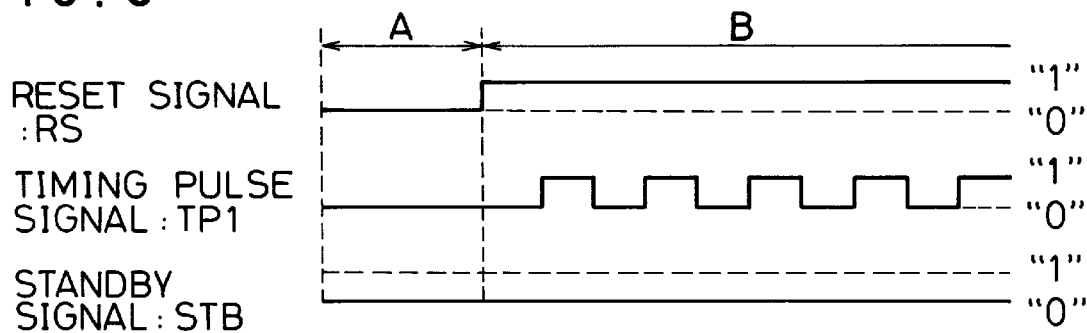
FIG. 3 is a timing chart showing phases of a reset signal, a timing pulse signal and a standby signal until an internal circuit starts its operation after reset signals have been provided to the internal circuit.

With further reference to FIG. 3 showing phases of the reset signal RS, the timing pulse signals TP1, TP2 and TP3, and the standby signal STB in the form of a timing chart, until the CPU 5 starts to operate after receiving the reset signal RS, the clock signal producing circuit 4, CPU 5 and the standby control circuit 6 are in initial reset condition during a duration A in which the reset signal RS is kept at "0" logic level. Accordingly, the circuits 4, 6 and CPU 5 are out of operation during the duration A.

In duration "B" in which the reset signal RS is changed from "0" logic level into "1" logic level and is kept at "1" logic level, the clock signal producing circuit 4 produces and transmits the timing pulse signals TP1, TP2 and TP3 to CPU 5, CPU 5 thereby starting its operation.

Figure 4:
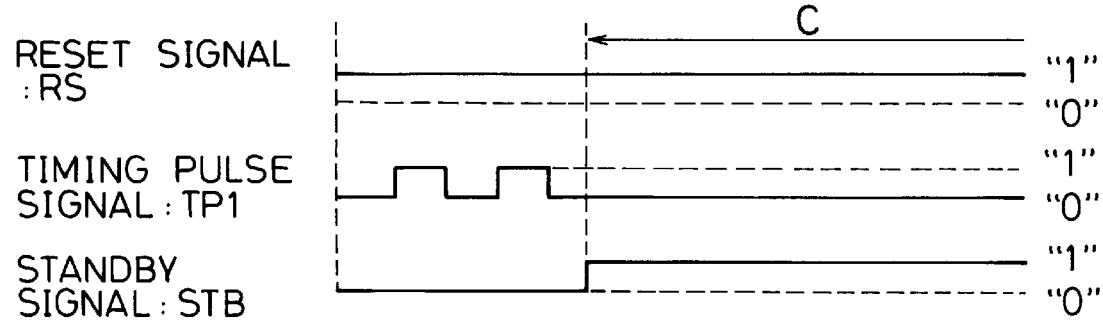
FIG. 4 is a timing chart showing phases of a reset signal, a timing pulse signal and a standby signal when an internal circuit is on standby.

Referring further to FIG. 4 showing phases of the reset signal RS, the timing pulse signals TP1, TP2 and TP3, and the standby signal STB when CPU 5 is on standby, in duration "C" in which the standby signal STB is changed from "0" logic level to "1" logic level and kept at "1" logic level with the reset signal RS being kept at "1" logic level, the clock signal producing circuit 4 ceases to transmit the timing pulse signals TP1, TP2 and TP3 and is kept at "0" logic level. Accordingly, CPU 5 is out of operation.

Figure 5:
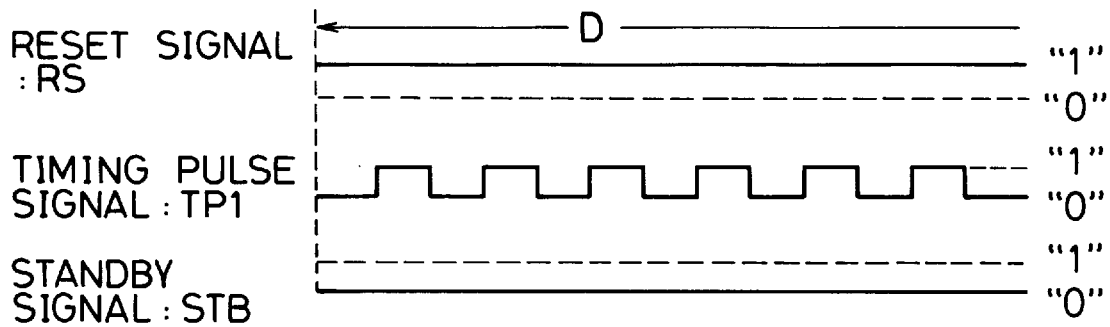
FIG. 5 is a timing chart showing phases of a reset signal, a timing pulse signal and a standby signal when an internal circuit is in operation.

Referring further to FIG. 5 showing phases of the reset signal RS, the timing pulse signals TP1, TP2 and TP3, and the standby signal STB when CPU 5 is in operation, in duration "D" in which the reset signal RS is kept at "1" logic level and the standby signal STB is kept at "0" logic level, the clock signal producing circuit 4 continues to transmit the timing pulse signals TP1, TP2 and TP3. Accordingly, CPU 5 is in operation.

What should be noted is that the reset signal RS is always kept at "1" logic level and the standby signal STB is always kept at "0" logic level while CPU 5 is in operation.

Figure 6A:
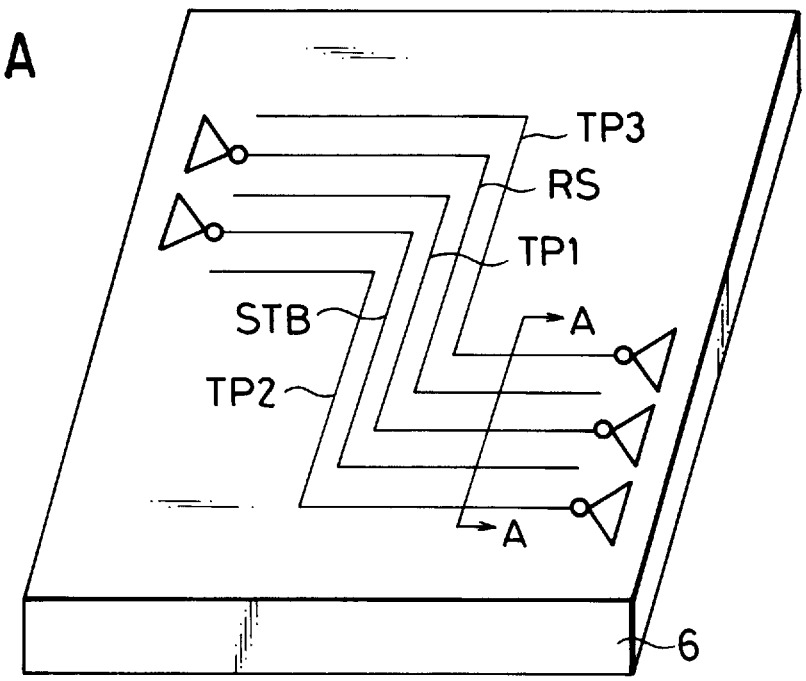
FIG. 6A is a perspective view of a circuit in which timing pulse signal lines are shielded by other lines.
Figure 6B:
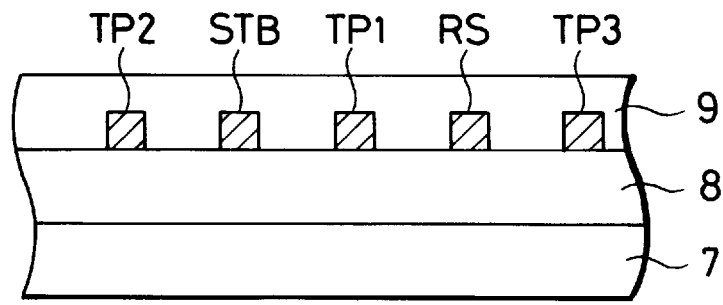
FIG. 6B is a cross-sectional view taken along the line A—A in FIG. 6A.

That is, it is possible to realize that both the reset signal RS and the standby signal STB are on a fixed dc potential, when CPU 5 is in operation. FIGS. 6A and 6B illustrate an example of wiring arrangements where the timing pulse signals are shielded by the reset signal RS and the standby signal STB both of which have a fixed dc level when CPU 5 is in operation. As illustrated in FIGS. 6A and 6B, there are formed five signal lines formed on an oxide layer 8 formed on a silicon substrate 7. The five signal lines are made of a common metal layer and equally spaced from one another in parallel. The timing pulse signals TP1, TP2 and TP3, the standby signal STB and the reset signal RS are transmitted through each of the five signal lines.

Specifically, the standby signal line STB is disposed adjacent to and in parallel with one of sides TP1-1 of the first timing pulse signal line TP1. The second timing pulse signal line TP2 is disposed adjacent to and in parallel with a side STB-1 of the standby signal line STB at the opposite side of the first timing pulse signal line TP1. The reset signal line RS is disposed adjacent to and in parallel with the other side TP1-2 of the first timing pulse signal line TP1. The third timing pulse signal line TP3 is disposed adjacent to and in parallel with a side RS-1 of the reset signal line RS at the opposite side of the first timing pulse signal line TP1. These signal lines TP1, TP2, TP3, RS and STB are covered with a nitride layer 9 to thereby be protected from atmosphere.

In brief, the reset signal line RS and the standby signal line STB are disposed intermediate between the first, second and third timing pulse signal lines TP1, TP2 and TP3 with an equal space being kept thereamong.

Since the standby signal line STB and the reset signal line RS are kept to have a fixed dc potential while CPU 5 is in operation, as mentioned earlier, the first timing pulse signal line TP1 is shielded by the standby signal line STB from the second timing pulse signal line TP2, and also is shielded by the reset signal line RS from the third timing pulse signal line TP3. Thus, it is possible to reduce a time constant on signal transmission in the timing pulse signal lines, resulting in almost zero clock skew.

The same effects as those of the above mentioned embodiment can be obtained, even if the reset signal line RS, being kept at "1" logic level, and the standby signal line STB, being kept at "0" logic level, are replaced in position with each other, while the CPU 5 is in operation.

Since the reset and standby signal lines RS and STB, which are essentially necessary for establishing a semiconductor integrated circuit, are utilized for shielding the timing pulse signal lines TP1, TP2 and TP3, it is possible to minimize an increase in a total wiring area of the chip required only for shielding.

Furthermore, since a minimum amount of contact holes are used, it is no longer necessary to have a large contact area for minimizing wiring resistivity like a case wherein power distributing lines are to be used.

Thus, the above mentioned first embodiment makes it possible to accomplish the same effect as that of the earlier mentioned prior art, namely, the shield effect accomplished by power distributing lines kept at a fixed dc level, without an increase in a total wiring area of a chip by using the standby and reset signal lines which are essentially necessary for requisite circuit functions.

Figure 7A:
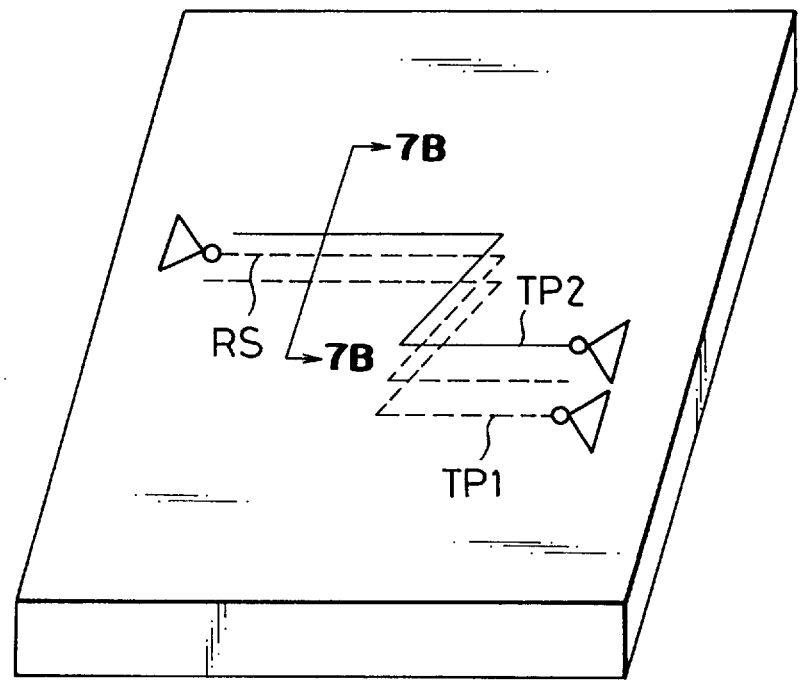
FIG. 7A is a perspective view of a semiconductor integrated circuit chip made in accordance with the second embodiment of the present invention.
Figure 7B:
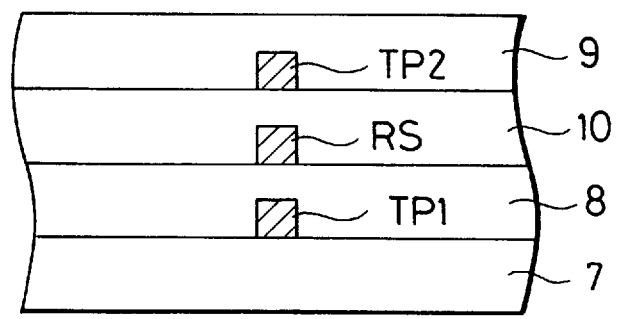
FIG. 7B is a sectional view taken along the line B—B in FIG. 7A.

Hereinbelow, a semiconductor integrated circuit chip made in accordance with the second embodiment of the present invention is explained. With reference to FIGS. 7A and 7B, there are vertically formed three signal lines formed above a silicon substrate 7. The three signal lines are two timing pulse signal lines TP1, TP2 and a reset signal line RS located intermediate between the timing pulse signal lines TP1 and TP2. Each of the three signal lines is made of a metal layer. The three signal lines are equally spaced from one another in parallel.

More specifically, the reset signal line RS composed of a second metal layer is formed above the timing pulse signal line TP1 composed of a metal layer with an oxide layer 8 sandwiched between the signal lines RS and TP1 for insulation. There a timing pulse signal line TP2 composed of a third metal layer formed above the reset signal line RS with an oxide layer 10 sandwiched between the signal lines RS and TP2 for insulation. The timing pulse signal line TP2 is covered with a nitride layer 9 for protection from outside air.

The five signal lines composed of a common metal layer are horizontally disposed adjacent to and in parallel with one another in the first embodiment, whereas the three signal lines composed of separate metal layers are vertically disposed adjacent to and in parallel with one another in the second embodiment. When an integrated circuit includes multi-layered wirings, clock skew is affected not only by a horizontal capacity change generated between sides of adjacent signal lines, but also by a vertical capacity change generated between vertically arranged signal lines. Hence, the second embodiment decreases clock skew by disposing the reset signal line RS between the timing pulse signal lines TP1 and TP2 to thereby accomplish shield effect.

Since the standby and reset signal lines STB and RS are kept to have a fixed dc level, for instance, kept at "0" and "1" logic level, respectively, while CPU 5 is in operation also in the second embodiment similarly to the first embodiment, the timing pulse signal line TP1 is shielded by the reset signal line RS from the timing pulse signal line TP2.

As to a total wiring area, since the reset signal line RS which is essentially necessary as a circuit function is utilized and a vertical multi-layered wirings structure is used, it is possible to minimize an increase in a total wiring area for shielding.

Thus, similarly to the earlier mentioned first embodiment, the second embodiment makes it possible to accomplish the same effect as that of the earlier mentioned prior art, namely, the shield effect accomplished by power distributing lines kept to have a fixed dc level, without an increase in a total wiring area of a chip by using the reset signal line which is essentially necessary for establishing a semiconductor integrated circuit chip.

In the above mentioned first and second embodiments, the reset and standby signal lines are used for shielding the timing pulse signal lines. However, it should be noted that any other signal lines may be used in place of the reset and standby signal lines unless they are kept at a fixed dc level while an internal circuit is in steady operation.

In the first embodiment, the three timing pulse signal lines TP1, TP2 and TP3 are exemplified as a signal line from which clock skew is generated, and two signal lines STB and RS are exemplified as signal lines which are kept at a fixed dc level while an internal circuit such as CPU is in operation. Similarly, in the second embodiment, the two timing pulse signal lines TP1, TP2 and the single signal line RS are exemplified. However, it should be noted that the number of those signal lines is not to be limited to the numbers in the first and second embodiments. The present invention can be applied to any other number of the signal lines TP1, TP2, TP3, RS and STB, unless a signal line or signal lines kept to have a fixed dc level like the signal line RS or STB is(are) disposed intermediate between signal lines generating clock skew therefrom like the timing pulse signal lines TP1, TP2 and TP3.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor integrated circuit chip comprising:
    at least one first signal type line;
    an internal circuit to which said first signal type line(s) is electrically connected;
    at least one second signal type line, said second signal type line(s) varying in potential during said integrated chip operation; and,
    means for shielding said first signal type line(s) by keeping said second signal type line(s) at a fixed potential whenever and only while said internal circuit is in operation, wherein said second signal type lines(s) provides control signals for operation of said semiconductor integrated circuit chip and is disposed substantially adjacent to and in parallel with said first signal type line(s).

2. A semiconductor integrated circuit chip comprising:
    N first signal type lines, wherein N is a positive integer equal to or greater than two;

an internal circuit to which said first signal type lines are electrically connected;

(N-1) second signal type line(s); and, means for shielding said N first signal type lines by keeping said second signal type lines at a fixed potential whenever and only while said internal circuit is in operation, wherein said second signal line(s) provide predetermined signals that can vary in potential for controlling said semiconductor integrated circuit chip, and each of said second signal line(s) is disposed intermediate in a predetermined fashion between said N first signal type lines.

3. The semiconductor integrated circuit chip as set forth in claim 2, wherein said first and second signal lines are horizontally arranged.

4. The semiconductor integrated circuit chip as set forth in claim 2, wherein said first and second signal lines are vertically arranged.

5. The semiconductor integrated circuit chip as set forth in claim 2, wherein said first and second signal lines are equally spaced from one another.

6. The semiconductor integrated circuit chip as set forth in claim 2, wherein N=3.

7. A semiconductor integrated circuit chip comprising:

a semiconductor substrate;

an insulating film formed on said semiconductor substrate;

first, second and third timing pulse signal lines each of which is formed of a common metal wiring layer;

an internal circuit to which said first, second and third timing pulse signal lines are electrically connected;

a first control signal line kept at a first predetermined potential only while said internal circuit is in operation; and a second control signal line kept at a second predetermined potential only while said internal circuit is in operation, said second control signal line being disposed with a first side adjacent to and in parallel with a predetermined side of said first timing pulse signal line, said second timing pulse signal line being disposed adjacent to and in parallel with a second side of said second control signal line and being disposed at the opposite side of said second control signal line from said first timing pulse signal line, said first control signal line being disposed adjacent to and in parallel with the side of said first timing pulse signal line opposite said predetermined side, and said third timing pulse signal line being disposed adjacent to and in parallel with the opposite side of said first control signal line from said first timing pulse signal line, wherein said first and second control signal lines can vary in potential when said internal circuit is not in operation.

8. A semiconductor integrated circuit chip comprising:

a semiconductor substrate;

an insulating film formed on said semiconductor substrate;

first, second and third timing pulse signal lines each of which is formed of a common metal wiring layer;

an internal circuit to which said first, second and third timing pulse signal lines are electrically connected;

a first control signal line kept at a high level while and whenever said internal circuit is in operation; and a second control signal line kept at a low level only while and whenever said internal circuit is in operation, and said first and second control signal lines being disposed intermediate in a predetermined arrangement between said first, second and third timing pulse signal lines and wherein said first and second control signal lines can vary in potential when said internal circuit is not in operation.

9. The semiconductor integrated circuit chip as set forth in claim 8, wherein said first and second control signal lines are equally spaced from said first, second and third timing pulse signal lines.

10. A semiconductor integrated circuit chip comprising:

a semiconductor substrate;

an insulating film formed on said semiconductor substrate;

N timing pulse signal lines each of which is formed of a common metal wiring layer, wherein N is a positive integer equal to or greater than two;

an internal circuit to which said timing pulse signal lines are electrically connected;

L first control signal line(s) kept at a high level only while and whenever said internal circuit is in operation, wherein L is an integer equal to or greater than zero; and M second control signal line(s) kept at a low level only while and whenever said internal circuit is in operation, wherein M is an integer equal to or greater than zero and the sum of L and M is equal to (N-1), each of said first and second control signal lines being disposed in an interpositional manner with said timing pulse signal lines and wherein said L first control signal line(s) and said M second control signal line(s) vary in potential when said internal circuit is not in operation.

11. The semiconductor integrated circuit chip as set forth in claim 10, wherein said first and second control signal lines and said timing pulse signal lines are equally spaced from one another.

12. A semiconductor integrated circuit chip comprising:

a semiconductor substrate;

an internal circuit to which a plurality of timing pulse signal lines are electrically connected;

said plurality of timing pulse signal lines comprising a first timing pulse signal line which is composed of a first metal layer, formed above said semiconductor substrate;

a control signal line which is composed of a second metal layer, formed above said first timing pulse signal line with respect to said semiconductor substrate, and which is designed to have a predetermined fixed potential only while and whenever said internal circuit is in operation, wherein said control signal line can vary in potential when said internal circuit is not in operation; and said plurality of timing pulse signal lines further comprising a second timing pulse signal line which is composed of a third metal layer formed above said control signal line.

13. The semiconductor integrated circuit chip as set forth in claim 12, wherein said control signal line is designed to keep a high level while said internal circuit is in operation.

14. The semiconductor integrated circuit chip as set forth in claim 12, wherein said control signal line is designed to keep a low level while said internal circuit is in operation.

15. The semiconductor integrated circuit chip as set forth in claim 12, wherein said first timing pulse signal line, said control signal line and said second timing pulse signal line are equally spaced from one another.

16. A semiconductor integrated circuit chip comprising:

N timing pulse signal lines each composed of a metal layer and vertically disposed above said semiconductor substrate in an insulating positional relationship with one another, wherein N is a positive integer equal to or greater than two;

an internal circuit to which said timing pulse signal lines are electrically connected; and (N-1) control signal line(s), each composed of a metal layer and designed to be at a fixed potential only while and whenever said internal circuit is in operation, each of said control signal line(s) being disposed vertically intermediate between said timing pulse signal lines in an insulating manner, wherein said (N-1) control signal line(s) can vary in potential when said internal circuit is not in operation.

17. The semiconductor integrated circuit chip as set forth in claim 16, wherein said timing pulse signal lines and said control signal line(s) are equally spaced from one another.

18. The semiconductor integrated circuit chip as set forth in claim 16, wherein said control signal line is designed to keep a high level while said internal circuit is in operation.

19. The semiconductor integrated circuit chip as set forth in claim 16, wherein said control signal line is designed to keep a low level while said internal circuit is in operation.

20. A semiconductor integrated circuit chip comprising:

a semiconductor substrate;

an insulating film formed on said semiconductor substrate;

first, second and third timing pulse signal lines each of which is formed of a common metal wiring layer;

an internal circuit to which said first, second and third timing pulse signal lines are electrically connected;

a first control signal line kept at a first predetermined potential only while and whenever said internal circuit is in operation; and a second control signal line kept at a second predetermined potential only while and whenever said internal circuit is in operation; and said first control signal line being disposed with a first side adjacent to and in parallel with a predetermined side of said first timing pulse signal line, said second timing pulse signal line being disposed adjacent to and in parallel with a second side of said first control signal line, being disposed at the opposite side of said first control signal line from said first timing pulse signal line, said second control signal line being disposed adjacent to and in parallel with the side of said first timing pulse signal line, opposite said predetermined side, and said third timing pulse signal line being disposed adjacent to and in parallel with the opposite side of said second control signal from said first timing pulse signal line, and wherein said first and second control signal lines can vary in potential when said internal circuit is not in operation.

* * * * *